United States Patent
Liu

(10) Patent No.: US 9,257,513 B1
(45) Date of Patent: Feb. 9, 2016

(54) SEMICONDUCTOR COMPONENT AND METHOD

(71) Applicant: Semiconductor Components Industries, LLC, Phoenix, AZ (US)

(72) Inventor: Chun-Li Liu, Scottsdale, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 14 days.

(21) Appl. No.: 14/452,162

(22) Filed: Aug. 5, 2014

(51) Int. Cl.
*H01L 21/00* (2006.01)
*H01L 29/40* (2006.01)
*H01L 21/02* (2006.01)
*H01L 21/74* (2006.01)

(52) U.S. Cl.
CPC ........ *H01L 29/407* (2013.01); *H01L 21/02304* (2013.01); *H01L 21/743* (2013.01); *H01L 21/746* (2013.01); *H01L 29/404* (2013.01); *H01L 29/408* (2013.01)

(58) Field of Classification Search
CPC ............ H01L 29/407; H01L 21/02304; H01L 29/404; H01L 29/408; H01L 21/746; H01L 21/743
See application file for complete search history.

(56) References Cited

U.S. PATENT DOCUMENTS

2011/0133251 A1   6/2011   He

FOREIGN PATENT DOCUMENTS

EP   0746040 A1   12/1996

OTHER PUBLICATIONS

Silvia Lenci, Brice De Jaeger, Laureen Carbonell, Jie Hu, Geert Mannaert, Dirk Wellekens, Shuzhen You, Benoit Bakeroot, Stefaan Decoutere, Au-Free AlGaN/GaN Power Diode on 8-in Si substrate with Gated Edge Termination ,IEEE Electron Device Letters, Aug. 2013, pp. 1035-1037, vol. 34, No. 8, IEEE.

Hidekazu Umeda, Asamira Suzuki, Yoshiharu Anda, Masahiro Ishida, Tetsuzo Udea, Tsuyoshi Tanaka, Daisuke Ueda, Blocking-Voltage Boosting Technology for GaN Transistors by Widening Depletion Layer in Si Substrates, Electron Devices Meeting (IEDM), Dec. 6-8, 2010, pp. 20.5.1-20.5.4, vol. 10-480, IEEE.

*Primary Examiner* — Long Pham
(74) *Attorney, Agent, or Firm* — Rennie William Dover

(57) ABSTRACT

In accordance with an embodiment, a method for manufacturing a semiconductor component includes providing a semiconductor material having a surface and forming a passivation layer on the semiconductor material Portions of the passivation layer are removed and portions of the semiconductor material exposed by removing the portions of the passivation layer are also removed. A layer of dielectric material is formed on the passivation layer and the exposed portions of the semiconductor material and first and second cavities are formed in the layer of dielectric material. The first cavity exposes a first portion of the semiconductor material and has at least one step shaped sidewall and the second cavity exposes a second portion of the semiconductor material. A first electrode is formed in the first cavity and a second electrode is formed in the second cavity.

18 Claims, 13 Drawing Sheets

SEMICONDUCTOR COMPONENT AND METHOD

TECHNICAL FIELD

The present invention relates, in general, to electronics and, more particularly, to semiconductor structures thereof, and methods of forming semiconductor devices.

BACKGROUND

In the past, the semiconductor industry used various different device structures and methods to form semiconductor devices such as, for example, diodes, Schottky diodes, Field Effect Transistors (FETs), High Electron Mobility Transistors (HEMTs), etc. Devices such as diodes, Schottky diodes, and FETs have been manufactured from compound semiconductor substrates such as, for example III-N materials. Drawbacks with semiconductor devices made from III-N materials such as gallium nitride (GaN)/aluminum gallium nitride (AlGaN) materials include high reverse leakage currents and low reverse breakdown voltages. To overcome these drawbacks, semiconductor manufacturers have used a dielectric layer at the anode of the device to reduce the reverse leakage current. U.S. Patent Application Publication Number 2011/0133251 A1 by Zhi He published on Jun. 9, 2011, describes using a dielectric layer at the anode to reduce the reverse leakage current. Although He teaches a technique to mitigate a high reverse leakage current, the issue of a low reverse breakdown voltage remains.

Accordingly, it would be advantageous to have a structure and method for manufacturing a semiconductor component using a III-N semiconductor substrate that addresses the performance specifications and manufacturability. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
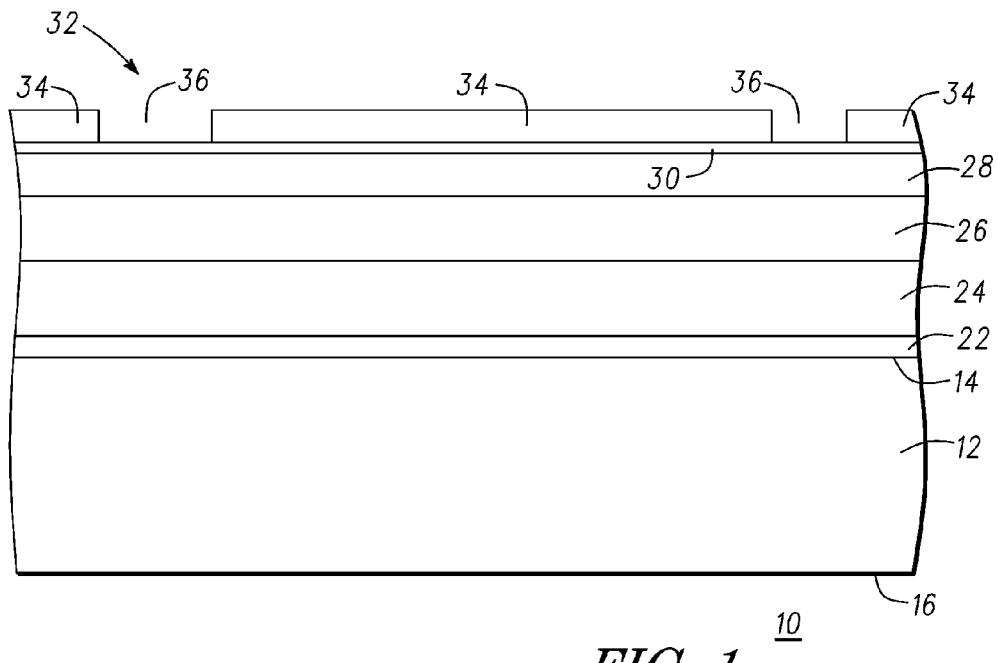
FIG. 1 is a cross-sectional view of a semiconductor component during manufacture in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

DETAILED DESCRIPTION

Generally, the present invention provides a semiconductor component and a method for manufacturing the semiconductor component wherein the semiconductor component comprises at least one stepped contact in contact with a semiconductor material. The semiconductor material may be comprised of a compound semiconductor material formed on a silicon substrate. The semiconductor material may be configured such that a nucleation layer is formed on a silicon substrate, a buffer layer is formed on the nucleation layer, a channel layer is formed on the buffer layer, and a strained layer is formed on the channel layer. In accordance with an embodiment, a passivation layer is formed on the semiconductor material and portions of the passivation layer are removed to form openings in the passivation layer that expose portions of the semiconductor material. A layer of dielectric material is formed on the passivation layer and on the portions of the semiconductor material exposed by the openings formed in the passivation layer. Openings are formed in the layer of dielectric material that re-expose the previously exposed portions of the semiconductor material, where a first opening is configured to have a sidewall that is configured as a portion of a field plate, wherein the portion of the field plate faces a second opening. A metallization system is formed in the first and second openings, wherein the metallization system forms first and second electrodes from the first and second openings, respectively.

In accordance with another embodiment, the method includes forming the single sidewall of the opening from which a contact is formed to have a step shape, wherein the opening is referred to as a single-sidewall step shaped opening or a single-sidewall stepped opening and the contact formed from this structure is referred to as a single-sided stepped contact.

In accordance with another embodiment, the method includes forming the first cavity portion with at least first and second sidewalls.

In accordance with another embodiment, the first opening has opposing sidewalls that are configured as steps and the second opening is configured as a T-shaped opening. A contact having step shaped opposing sidewalls is formed from the first opening and a contact having a T-shape is formed from the other opening. Because two sidewalls of the opening from which a contact is formed are stepped or step shaped, the opening is referred to as a double-sidewall step shaped opening or a double-sidewall stepped opening and the contact formed from this structure is referred to as a double-sided stepped contact.

In accordance with another embodiment, the first opening has opposing sidewalls that are configured as steps and the second opening has opposing sidewalls where the sidewall of the opposing sidewalls facing the first opening is configured to have steps. Because two sidewalls of the first opening from which a contact is formed are stepped or step shaped, the first opening is referred to as a double-sidewall step shaped opening or a double-sidewall stepped opening and the contact formed from this structure is referred to as a double-sided stepped contact. A contact having step shaped opposing sidewalls is formed from the first opening and a contact having a stepped sidewall is formed from the other opening. Because a single sidewall of the second opening from which a contact is formed is stepped or step shaped, the second opening is referred to as a single-sidewall step shaped opening or a single-sidewall stepped opening and the contact formed from this structure is referred to as a single-sided stepped contact.

In accordance with another embodiment, the first opening has opposing sidewalls wherein one of the opposing sidewalls is configured to have a step shape and the other opposing sidewall is configured to have sloped shape, and the second opening is configured as a T-shaped opening. The sidewall in the first opening that has the sloped shape faces the T-shaped opening. A contact having a step shaped sidewall and a sloped sidewall is formed from the first opening and a contact having a T-shape is formed from the second opening. It should be noted that the sloped sidewall may be referred to as an angled sidewall, a slanted sidewall, or a beveled sidewall. Because a one sidewall of the first opening from which a contact is formed is stepped or step shaped and the opposing sidewall is sloped, the opening is referred to as a stepped-sloped opening or a stepped-angled opening or a stepped-beveled opening or a stepped-slanted opening and the contact formed from this structure is referred to as a stepped-sloped contact or a stepped-angled contact, or a stepped-beveled contact or a stepped-slanted contact. Because the second opening has a T-shape, the contact formed from this structure is referred to as a T-shaped contact.

In accordance with another embodiment, the first opening has opposing sidewalls wherein one of the sidewalls is configured to have a step shape and the other sidewall is configured to have a sloped shape, and the second opening has opposing sidewalls where the sidewall of the opposing sidewalls facing the first opening is configured to have steps. A stepped-sloped contact is formed from the first opening and a beveled sidewall is formed from the first opening and a single-sided stepped contact is formed from the second opening.

In accordance with another embodiment, the first opening has opposing sidewalls wherein the opposing sidewalls of the first opening are configured to be sloped and the second opening is configured as a T-shaped opening. The first opening having the having the sloped sidewalls is referred to as a double-sided sloped opening, or a double-sided angled opening, or a double-sided beveled opening, or a double-sided slanted opening. A contact is formed from the double-sided sloped opening is referred to as a double-sided sloped contact, or a double-sided angled contact, or a double-sided beveled contact, or a double-sided slanted contact. A T-shaped contact is formed from the second opening.

In accordance with another embodiment, the method includes forming the first sidewall of the first cavity portion to have a first step having a first step distance and forming the second cavity portion to have at least first and second sidewalls, the first sidewall of the second cavity portion having a second step that has a second step distance, the first step distance greater than the second step distance.

In accordance with another embodiment, the method includes forming a third cavity portion having at least first and second sidewalls, the first sidewall of the third cavity portion having a third step that has a third step distance, the second step distance greater than the third step distance.

In accordance with another embodiment, the method includes providing a semiconductor material comprising a semiconductor substrate, a nucleation layer on the semiconductor substrate; a buffer region over the nucleation layer; a channel layer over the buffer region; and a strained layer over the channel layer.

In accordance with another embodiment, the method includes forming a buffer region that includes one or more layers of a III-N material configured to be a buffer region.

In accordance with another embodiment, a method for manufacturing a semiconductor component is provided that comprises: providing a semiconductor material, wherein the semiconductor material comprises a plurality of layers including a strained layer having a surface; forming a first layer of dielectric material on the strained layer; exposing first and second portions of the strained layer; forming first and second cavities in the exposed portions of the first and second portions of the strained layer; forming a second layer of dielectric material over the first layer of dielectric material and in the first and second cavities; forming a first contact cavity in the second layer of dielectric material and a second contact cavity in the second layer of dielectric material, the first contact cavity exposing the first portion of the strained layer and the second contact cavity exposing the second portion; and forming a first contact in the first contact cavity and a second contact in the second contact cavity, the first contact extending towards the second contact and serving as a field plate.

In accordance with another embodiment, a first contact cavity having a plurality of asymmetric steps and a cavity having a symmetric step are formed in the a layer of dielectric material.

In accordance with another embodiment, a first contact cavity having a plurality of asymmetric steps is formed in the layer of dielectric material by forming a first portion of the first contact cavity having a first lateral dimension; forming a second portion of the first contact cavity having a second lateral dimension, the second portion vertically adjacent the first portion and the first lateral dimension greater than the second lateral dimension; and forming a third portion of the first contact cavity having a third lateral dimension, the third portion vertically adjacent the second portion and the second lateral dimension greater than the third lateral dimension.

In accordance with another embodiment, a contact cavity having a plurality of asymmetric steps and a cavity having a T-shape are formed in the layer of dielectric material.

In accordance with another embodiment, a first contact cavity having first and second opposing sidewalls is formed, the first opposing sidewall having a sloped shape.

In accordance with another embodiment, a first contact cavity having first and second opposing sidewalls is formed, the first opposing sidewall having a sloped shape and the second opposing sidewall having a sloped shape.

In accordance with another embodiment, a first contact cavity having first and second opposing sidewalls is formed wherein the first opposing sidewall has a sloped shape and the second opposing sidewall has a stepped shape.

In accordance with another embodiment, a first contact cavity having first and second opposing sidewalls is formed wherein the first opposing sidewall has a stepped shape and the second opposing sidewall has a stepped shape.

In accordance with another embodiment, a first contact cavity having first and second opposing sidewalls is formed, the first opposing sidewall having a sloped shape and the second opposing sidewall having a sloped shape and wherein a second contact cavity having first and second opposing sidewalls is formed, the first opposing sidewall having a stepped shape.

In accordance with another embodiment, a first contact cavity having first and second opposing sidewalls is formed, the first opposing sidewall having a sloped shape and the second opposing sidewall having a sloped shape and wherein a second contact cavity having a T-shape is formed.

In accordance with another embodiment, a first contact cavity having first and second opposing sidewalls is formed, the first opposing sidewall having a step shape and the second opposing sidewall having a stepped shape and wherein a second contact cavity having first and second opposing sidewalls is formed, the first opposing sidewall having a stepped shape.

In accordance with another embodiment, a semiconductor component comprises: a compound semiconductor material having a surface; a dielectric layer over the compound semiconductor material; a first contact extending through the dielectric layer and contacting a first portion of the compound semiconductor material; and a second contact having first and second portions, the first portion extending vertically through the dielectric layer and contacting a first portion of the compound semiconductor material and the second portion extending horizontally toward the first contact.

In accordance with another embodiment, the semiconductor component includes a first contact having a T-shape.

In accordance with another embodiment, the semiconductor component includes a first contact having a T-shape and a second semiconductor contact having first and second sidewalls, the first sidewall having a stepped configuration and the second sidewall having a sloped configuration.

In accordance with another embodiment, the semiconductor component includes a first contact having a T-shape and a second semiconductor contact having first and second sidewalls, the first sidewall having a sloped configuration and the second sidewall having a sloped configuration.

In accordance with another embodiment, the semiconductor component includes a first contact having first and second sidewalls, the first sidewall having a stepped configuration.

FIG. 1 is a cross-sectional view of a portion of a semiconductor component 10 such as, for example, a Light Emitting Diode (LED), a power switching device, a regulator, a protection circuit, a driver circuit, etc. during manufacture in accordance with an embodiment of the present invention. What is shown in FIG. 1 is a semiconductor substrate 12 having opposing surfaces 14 and 16. Surface 14 may be referred to as a front or top surface and surface 16 may be referred to as a bottom or back surface. Semiconductor substrate 12 may be of p-type conductivity, n-type conductivity, or an intrinsic semiconductor material. In accordance with this embodiment, semiconductor substrate 12 is silicon doped with an impurity material of p-type conductivity and has a resistivity ranging from about $1 \times 10^{-3}$ Ohm-centimeters ($\Omega$-cm) to about 100 $\Omega$-cm. Other suitable materials for substrate 12 include carbon doped silicon, compound semiconductor materials such as, for example, gallium nitride, gallium arsenide, indium phosphide, Group III-V semiconductor materials, Group II-VI semiconductor materials, or the like.

A nucleation layer 22 having a thickness ranging from about 0.001 µm to about 1.0 µm is formed on substrate 12. By way of example, nucleation layer 22 is aluminum nitride. Other suitable materials for nucleation layer 22 include silicon and aluminum nitride, aluminum gallium nitride, silicon carbide, or the like. Nucleation layer 22 can be formed using Molecular Beam Epitaxy (MBE), Physical Vapor Deposition (PVD), or chemical vapor deposition techniques such as, for example, a Metalorganic Chemical Vapor Deposition (MOCVD) technique, a Plasma-enhanced Chemical Vapor Deposition (PECVD) technique, a Low Pressure Chemical Vapor Deposition (LPCVD) technique, or the like.

A buffer layer 24 having a thickness ranging from about 0.1 µm to about 100 µm is formed on nucleation layer 22 at a temperature ranging from about 150 degrees Celsius (° C.) to about 1,500° C. Suitable materials for buffer layer 24 include Group III-N materials such as, for example, aluminum nitride (AlN), gallium nitride (GaN), indium nitride (InN), aluminum gallium nitride (AlGaN), aluminum indium nitride (AlInN), aluminum indium gallium nitride (AlInGaN), indium gallium nitride (InGaN), or the like. Buffer layer 24 may be formed using MBE, PECVD, MOCVD, Metal Organic Vapor Phase Epitaxy (MOVPE), Remote Plasma Enhanced Chemical Vapor Deposition (RP-CVD), hydride vapor phase epitaxy (HVPE), liquid phase Epitaxy (LPE), Chloride Vapor Phase Epitaxy (Cl-VPE), or the like. It should be noted that buffer layer 24 may be comprised of a plurality of layers such as for example a plurality of AlN layers, a plurality of GaN layers, or alternating stacked MN and GaN layers. Buffer layer 24 may be of p-type, n-type, or it may be an intrinsic semiconductor material.

A channel layer 26 having a thickness ranging from about 0.01 µm to about 10 µm is formed on buffer layer 24 using one or more techniques selected from the group of techniques comprising MBE, PECVD, MOCVD, MOVPE, RP-CVD, HVPE, LPE, Cl-VPE, or the like. By way of example, channel layer 26 is a GaN layer having a thickness ranging from about 0.1 µm to about 0.5 µm. Buffer layer 24 may be comprised of an aluminum gallium nitride (AlGaN) superlattice, an aluminum gallium nitride/gallium nitride (AlGaN/GaN) superlattice, an aluminum nitride/gallium nitride (AlN/GaN) superlattice, or the like.

A strained layer 28 having a thickness ranging from about 1.0 nanometer (nm) to about 1,000 nm is formed on channel layer 26 using one or more techniques selected from the group of techniques comprising MBE, PECVD, MOCVD, MOVPE, RP-CVD, HYPE, LPE, Cl-VPE, or the like. By way of example, strained layer 28 is an AlGaN layer having a thickness ranging from about 5 nm to about 50 nm.

A layer of dielectric material 30 having a thickness ranging from about 1 nm to about 1 µm is formed on strained layer 28. Dielectric layer 30 may be referred to as a field oxide or a field oxide layer. Suitable materials for dielectric layer 30 include oxide, nitride, silicon dioxide, silicon nitride, or the like. A layer of photoresist is patterned over dielectric layer 30 to form a masking structure 32 having masking elements 34 and openings 36 that expose portions of dielectric layer 30.

Figure 2:
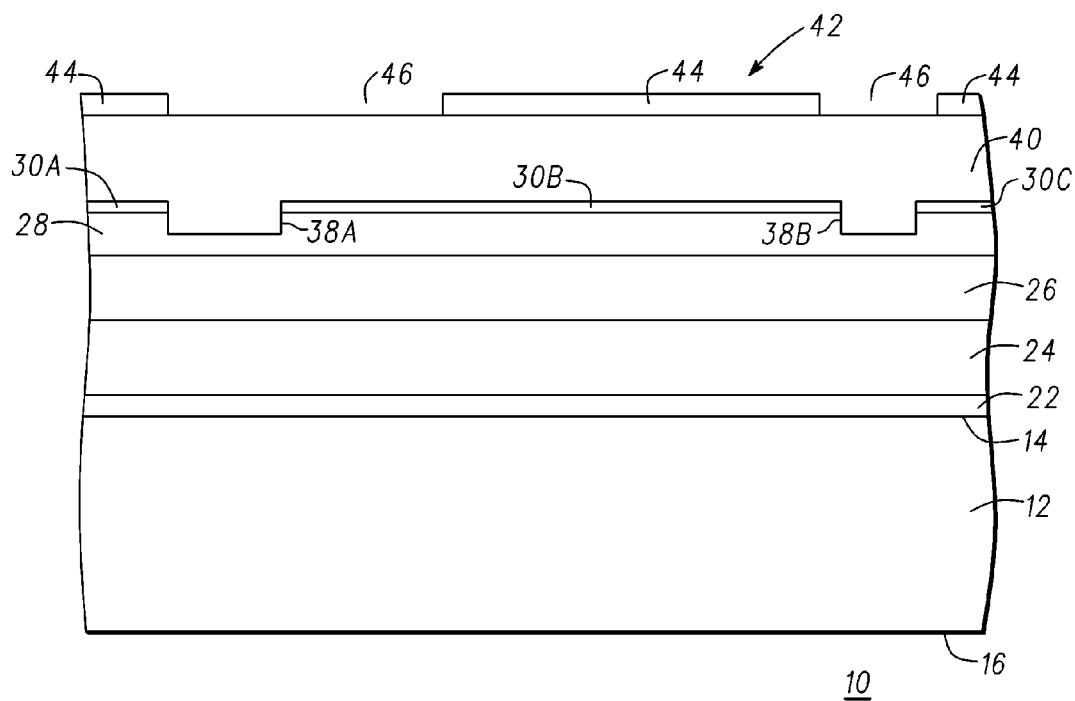
FIG. 2 is a cross-sectional view of the semiconductor component of FIG. 1 at a later stage of manufacture.

Referring now to FIG. 2, the portions of dielectric layer 30 unprotected by masking elements 34 are removed using a wet etchant that selectively etches the material of dielectric layer 30. By way of example, the wet etchant is a buffered oxide etchant. The etch leaves portions 30A, 30B, and 30C of dielectric layer 30 and exposes portions of strained layer 28. Cavities 38A and 38B are formed through the exposed portions of strained layer 28. Masking elements 34 are removed and a layer of dielectric material 40 having a thickness ranging from about 1 µm to about 1,000 µm is formed on the exposed portions of strained layer 28, i.e., in cavities 38A and 38B, and on portions 30A, 30B, and 30C of dielectric layer 30.

A layer of photoresist is patterned over dielectric layer 40 to form a masking structure 42 having masking elements 44 and openings 46 that expose portions of dielectric layer 40.

Figure 3:
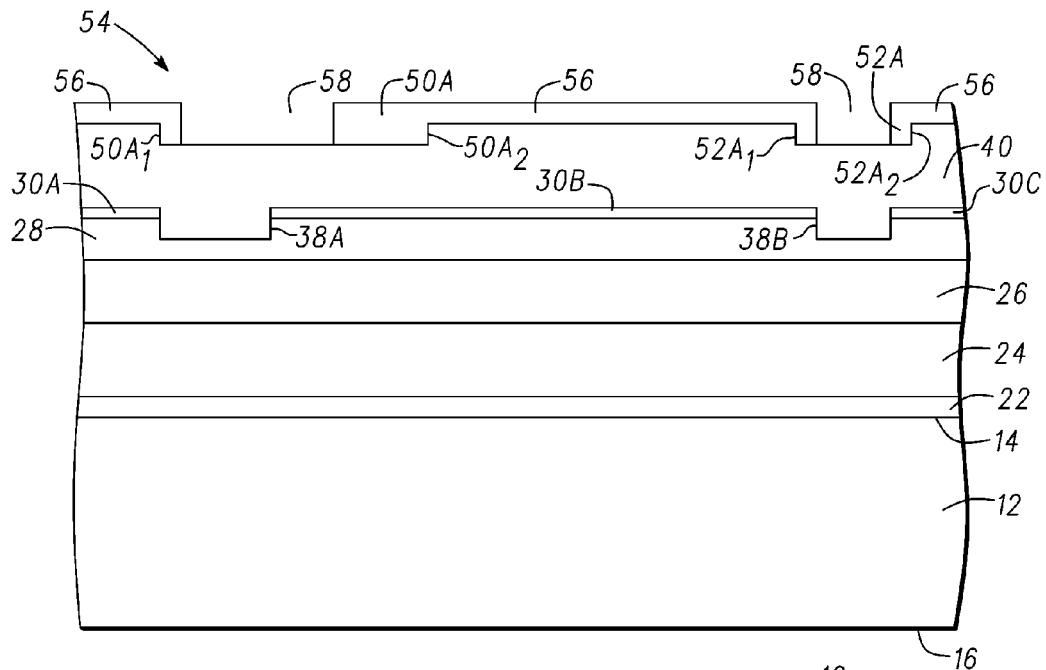
FIG. 3 is a cross-sectional view of the semiconductor component of FIG. 2 at a later stage of manufacture.

Referring now to FIG. 3, the portions of dielectric layer 40 unprotected by masking elements 44 are removed using a wet etch that selectively etches the material of dielectric layer 40 to form cavity portion 50A having sidewalls $50A_1$ and $50A_2$ and to form a cavity portion 52A having sidewalls $52A_1$ and $52A_2$. By way of example, the wet etch is a timed etch and the etchant for the wet etch is a buffered oxide etchant when the material of dielectric layer 40 is oxide. Masking elements 44 are removed and a layer of photoresist is patterned over dielectric layer 40 to form a masking structure 54 having masking elements 56 and openings 58 that expose portions of dielectric layer 40 within cavity portions 50A and 52A.

Figure 4:
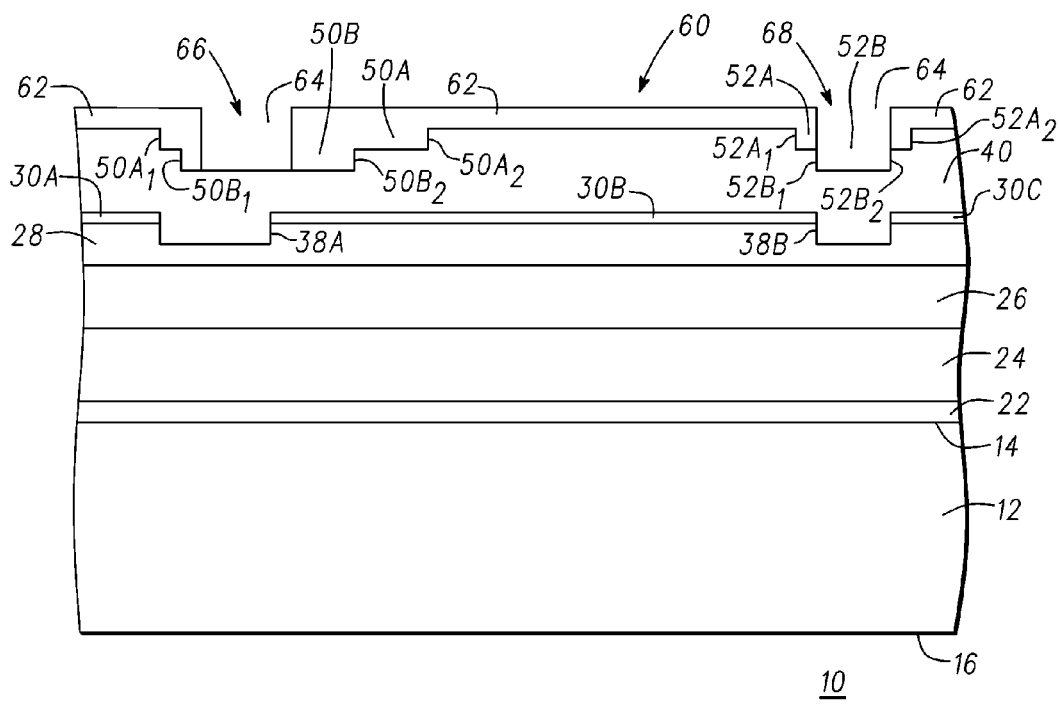
FIG. 4 is a cross-sectional view of the semiconductor component of FIG. 3 at a later stage of manufacture.

Referring now to FIG. 4, the portions of dielectric layer 40 unprotected by masking elements 56 are removed using a wet etch that selectively etches the material of dielectric layer 40 to form cavity portions 50B and 52B, wherein cavity portion 50B has sidewalls $50B_1$ and $50B_2$ and cavity portion 52B has sidewalls $52B_1$ and $52B_2$. By way of example, the wet etch is a timed etch and the etchant for the wet etch is a buffered oxide etchant when the material of dielectric layer 40 is oxide. Masking elements 56 are removed and a layer of photoresist is patterned over dielectric layer 40 to form a masking structure 60 having masking elements 62 and openings 64 that expose a portion 66 of dielectric layer 40 within cavity portions 50A and 50B and a portion 68 of dielectric layer 40 within cavity portions 52A and 52B.

Figure 5:
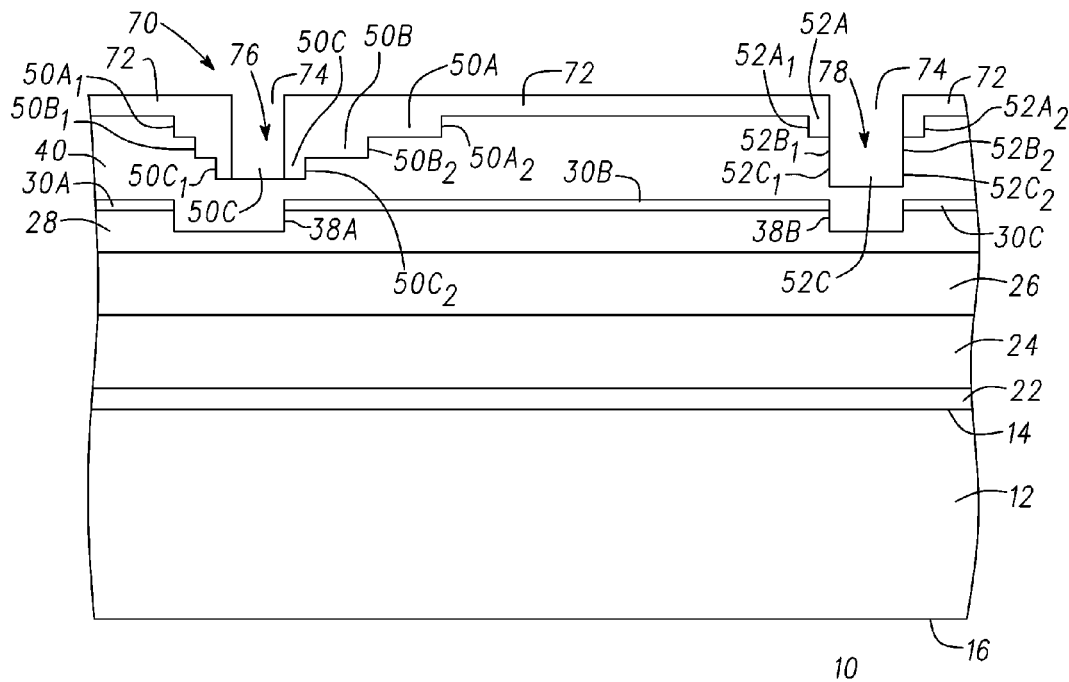
FIG. 5 is a cross-sectional view of the semiconductor component of FIG. 4 at a later stage of manufacture.

Referring now to FIG. 5, the portions of dielectric layer 40 unprotected by masking elements 62 are removed using a wet etch that selectively etches the material of dielectric layer 40 to form cavity portions 50C and 52C, wherein cavity portion 50C has sidewalls $50C_1$ and $50C_2$ and cavity portion 52C has sidewalls $52C_1$ and $52C_2$. Cavity portion 52C may be referred to as an extension of cavity portion 52B. By way of example, the wet etch is a timed etch and the etchant for the wet etch is a buffered oxide etchant when the material of dielectric layer 40 is oxide. Masking elements 62 are removed and a layer of photoresist is patterned over dielectric layer 40 to form a masking structure 70 having masking elements 72 and openings 74 that expose a portion 76 of dielectric layer 40 within cavity portions 50A, 50B, and 50C and a portion 78 of dielectric layer 40 within cavity portions 52A, 52B, and 52C.

Figure 6:
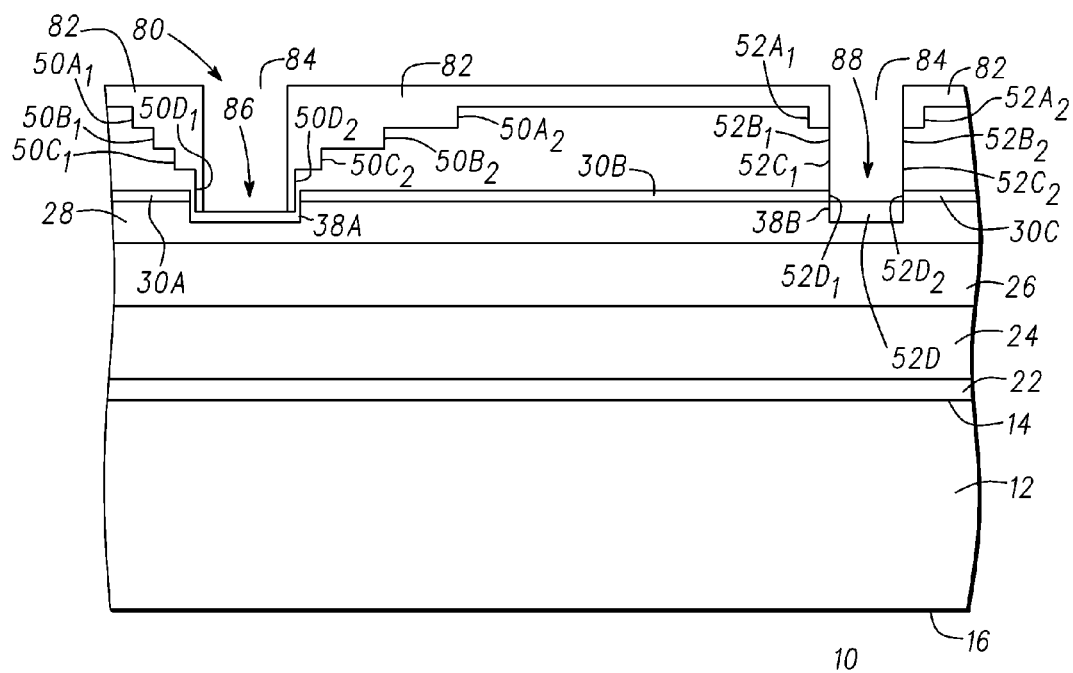
FIG. 6 is a cross-sectional view of the semiconductor component of FIG. 5 at a later stage of manufacture.

Referring now to FIG. 6, the portions of dielectric layer 40 unprotected by masking elements 72 are removed using a wet etch that selectively etches the material of dielectric layer 40 to form cavity portions 50D and 52D, wherein cavity portion 50D has sidewalls $50D_1$ and $50D_2$ and cavity portion 52D has sidewalls $52D_1$ and $52D_2$. Cavity portion 52D may be referred to as an extension of one or all of cavity portions 52A, 52B, and 52C. By way of example, the wet etch is a timed etch and the etchant for the wet etch is a buffered oxide etchant when the material of dielectric layer 40 is oxide. Masking elements 72 are removed and a layer of photoresist is patterned over dielectric layer 40 to form a masking structure 80 having masking elements 82 and openings 84 that expose a portion 86 of dielectric layer 40 within cavity portions 50A, 50B, 50C, and 50D and a portion 88 of dielectric layer 40 within cavity portions 52A, 52B, 52C, and 52D.

Figure 7:
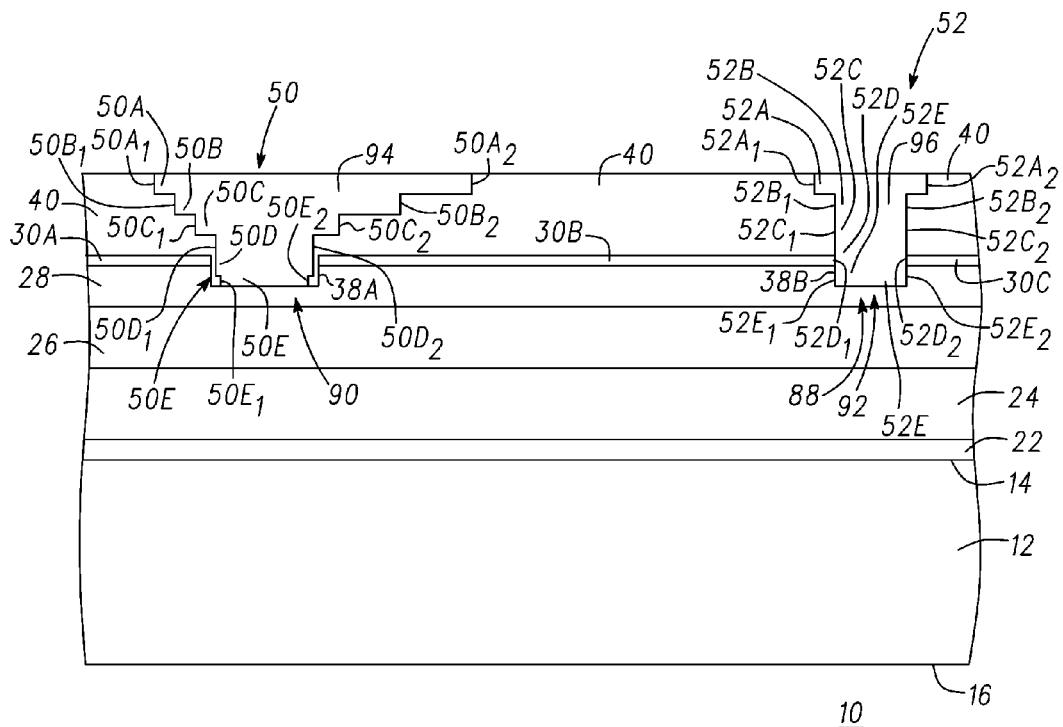
FIG. 7 is a cross-sectional view of the semiconductor component of FIG. 6 at a later stage of manufacture.

Referring now to FIG. 7, the portions of dielectric layer 40 unprotected by masking elements 82 are removed using a wet etch that selectively etches the material of dielectric layer 40 to form cavity portions 50E and 52E and expose portions 90 and 92, respectively, of strained layer 28. Cavity portion 50E has sidewalls $50E_1$ and $50E_2$, and cavity portion 52E has sidewalls $52E_1$ and $52E_2$. By way of example, the wet etch is a timed etch and the etchant for the wet etch is a buffered oxide etchant when the material of dielectric layer 40 is oxide. Masking elements 82 are removed. Cavity portions 50A-50E form a stepped cavity 50 or a stepped cavity structure 50 and cavity portions 52A-52E form a T-shaped cavity 52 or a T-shaped cavity structure. Stepped cavity structure 50 may be referred to as a stepped cavity and T-shaped cavity structure 52 may be referred to a T-shaped cavity. Because two sidewalls of stepped cavity or opening 50 from which a contact is to be formed are stepped or step shaped, cavity 50 may be referred to as a double-sidewall step shaped opening or a double-sidewall stepped opening.

It should be noted that cavity portions 50A-50E form a contact opening having a plurality of steps. The step formed by cavity portion 50A is wider than the step formed by cavity portion 50B; the step formed by cavity portion 50B is wider than the step formed by cavity portion 50C; the step formed by cavity portion 50C is wider than the step formed by cavity portion 50D; and the step formed by cavity portion 50D is wider than the step formed by cavity portion 50E. Accordingly, the distance between sidewalls $50A_1$ and $50A_2$ is greater than the distance between sidewalls $50B_1$ and $50B_2$; the distance between sidewalls $50B_1$ and $50B_2$ is greater than the distance between sidewalls $50C_1$ and $50C_2$; the distance between sidewalls $50C_1$ and $50C_2$ is greater than the distance between sidewalls $50D_1$ and $50D_2$; and the distance between sidewalls $50D_1$ and $5D_2$ is greater than the distance between sidewalls $50E_1$ and $50E_2$.

In accordance with an embodiment, the steps formed by cavity portions 50A-50E are asymmetric, wherein a horizontal distance from sidewall $50B_1$ of cavity portion 50B to sidewall $50A_1$ of cavity portion 50A, referred to as a step distance or lateral dimension, is less than a horizontal distance from sidewall $50B_2$ of cavity portion 50B to sidewall $50A_2$ of cavity portion 50A, referred to as a step distance or lateral dimension. A horizontal distance from sidewall $50C_1$ of cavity portion 50C to sidewall $50A_1$ of cavity portion 50A, referred to as a step distance or lateral dimension, is less than a horizontal distance from sidewall $50C_2$ of cavity portion 50C to sidewall $50A_2$ of cavity portion 50A, referred to as a step distance or lateral dimension. A horizontal distance from sidewall $50D_1$ of cavity portion 50D to sidewall $50A_1$ of cavity portion 50A, referred to as a step distance or lateral dimension, is less than a horizontal distance from sidewall $50D_2$ of cavity portion 50D to sidewall $50A_2$ of cavity portion 50A, referred to as a step distance or lateral dimension. A horizontal distance from sidewall $50E_1$ of cavity portion 50E to sidewall $50A_1$ of cavity portion 50A, referred to as a step distance or lateral dimension, is less than a horizontal distance from sidewall $50E_2$ of cavity portion 50E to sidewall $50A_2$ of cavity portion 50A, referred to as a step distance or lateral dimension. Thus, cavity portions 50A, 50B, 50C, 50D, and 50E form a stepped cavity having a plurality of asymmetric steps and cavity portions 52A, 52B, 52C, 52D, and 52E form a T-shaped cavity, wherein cavity portions 50A-50E of cavity 50 are referred to as having a stepped configuration.

Figure 8:
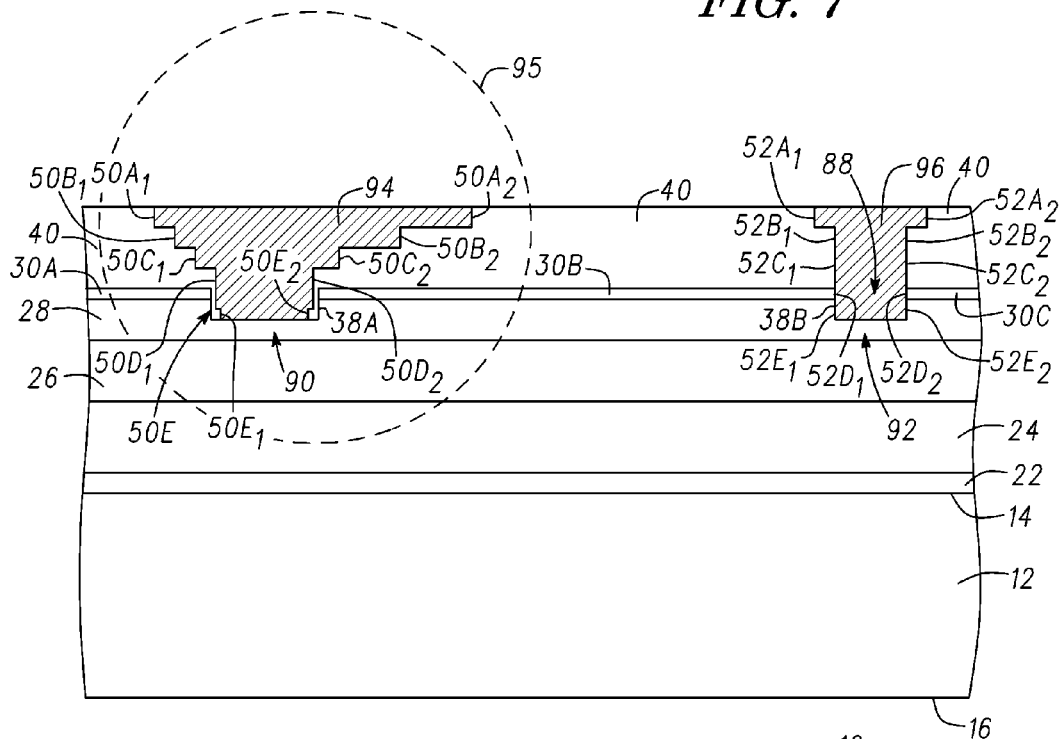
FIG. 8 is a cross-sectional view of the semiconductor component of FIG. 7 at a later stage of manufacture.

Referring now to FIG. 8, a contact 94 is formed from stepped cavity 50 and a contact 96 is formed from T-shaped cavity 52. Because contact 94 is formed from a double-sidewall stepped opening, contact 94 may be referred to double-sided stepped contact. Because contact 96 is formed from a T-shaped cavity or opening, it may be referred to as a T-shaped contact. Contacts 94 and 96 may be formed from metallization systems that include a refractory metal layer formed on dielectric layer 40 and on the exposed portions 90 and 92 of strained layer 28, one or more barrier metal layers may be formed on the refractory metal layer, and a contact metal may be formed on the one or more barrier metal layers. Contact 94 formed in stepped cavity 50 is a step shaped contact and may be referred to as a field plate having a stepped configuration or a step-shaped field plate. In accordance with embodiments in which semiconductor component 10 is a diode, field plate 94 serves as a cathode of the diode and T-shaped contact 96 serves as an anode of the diode.

Figure 9:
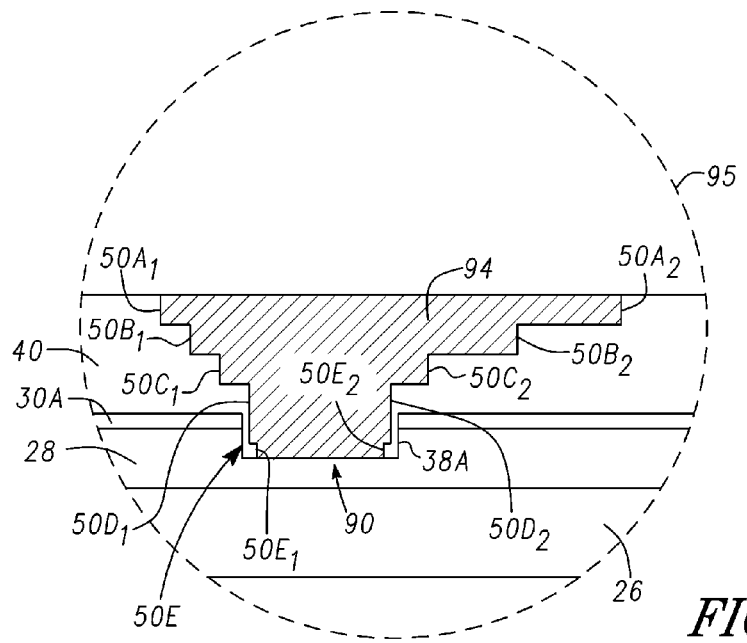
FIG. 9 is an expanded of a portion of the semiconductor component of FIG. 8.

FIG. 9 is an expanded view of the portion of semiconductor component 10 shown in broken circle 95 of FIG. 8.

Figure 10:
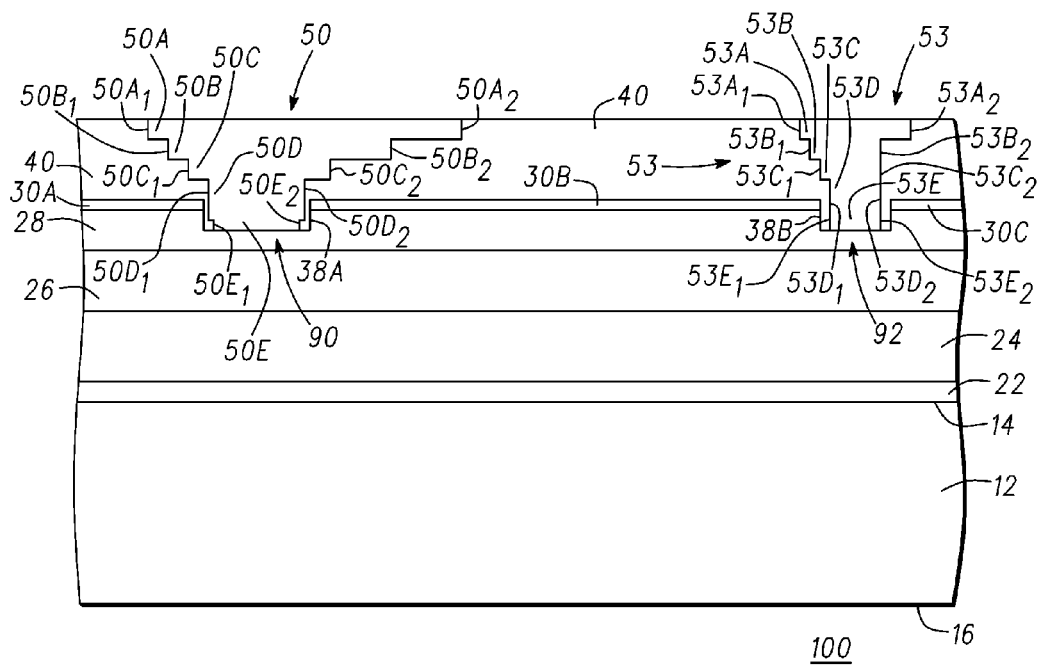
FIG. 10 is a cross-sectional view of a semiconductor component during manufacture in accordance with another embodiment of the present invention.

FIG. 10 is a cross-sectional view of a semiconductor component 100 during manufacture in accordance with another embodiment of the present invention. It should be noted that semiconductor component 100 is similar to semiconductor component 10 except that T-shaped contact opening 52 is replaced by a stepped contact opening 53, i.e., a contact opening having stepped or step-shaped sides, wherein the steps of contact opening 53 are on a side of stepped contact opening 53 facing stepped contact opening 50. Stepped contact opening 53 is comprised of cavity portions 53A, 53B, 53C, 53D, and 53E formed from dielectric layer 40. Cavity portion 53A has sidewalls $53A_1$ and $53A_2$, cavity portion 53B has sidewalls $53B_1$ and $53B_2$, cavity portion 53C has sidewalls $53C_1$ and $53C_2$, cavity portion 53D has sidewalls $53D_1$ and $53D_2$, and cavity portion 53E has sidewalls $53E_1$ and $53E_2$. Techniques for forming stepped contact opening 53 may be similar to those for forming stepped contact opening 50. Because a single sidewall of the opening from which a contact to be formed is stepped or step shaped, the opening is referred to as a single-sidewall step shaped opening or a single sidewall stepped opening.

Figure 11:
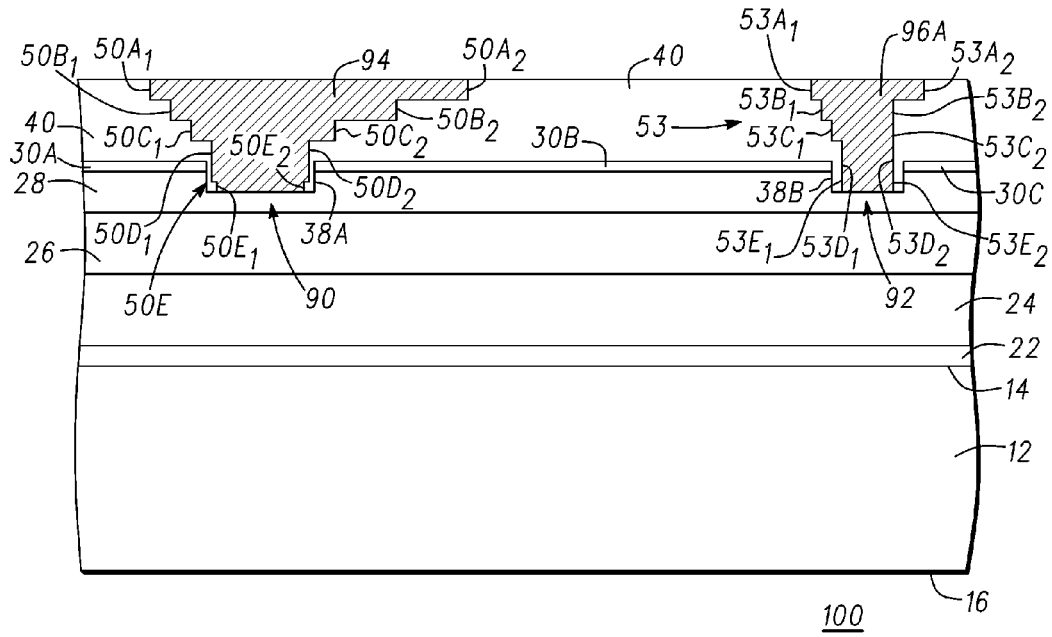
FIG. 11 is a cross-sectional view of the semiconductor component of FIG. 10 at a later stage of manufacture.

Referring now to FIG. 11, an electrically conductive material is formed in stepped contact openings 50 and 53 to form stepped contacts 94 and 96A, respectively. Techniques for forming stepped contact 96A may be similar to those for forming stepped contact 94 or T-shaped contact 96. Because contact 94 is formed from a double-sidewall stepped opening, it may be referred to as a double-sided stepped contact and because contact 96A is formed from a single-sidewall step shaped opening, it may be referred to as a single sided stepped contact.

Figure 12:
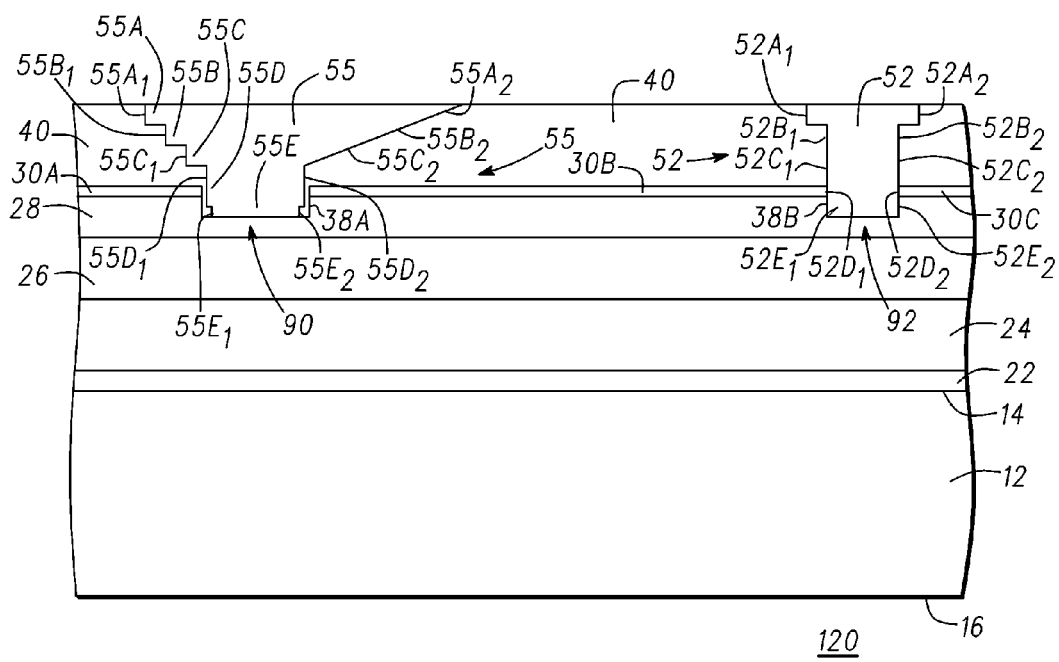
FIG. 12 is a cross-sectional view of a semiconductor component during manufacture in accordance with another embodiment of the present invention.
Figure 13:
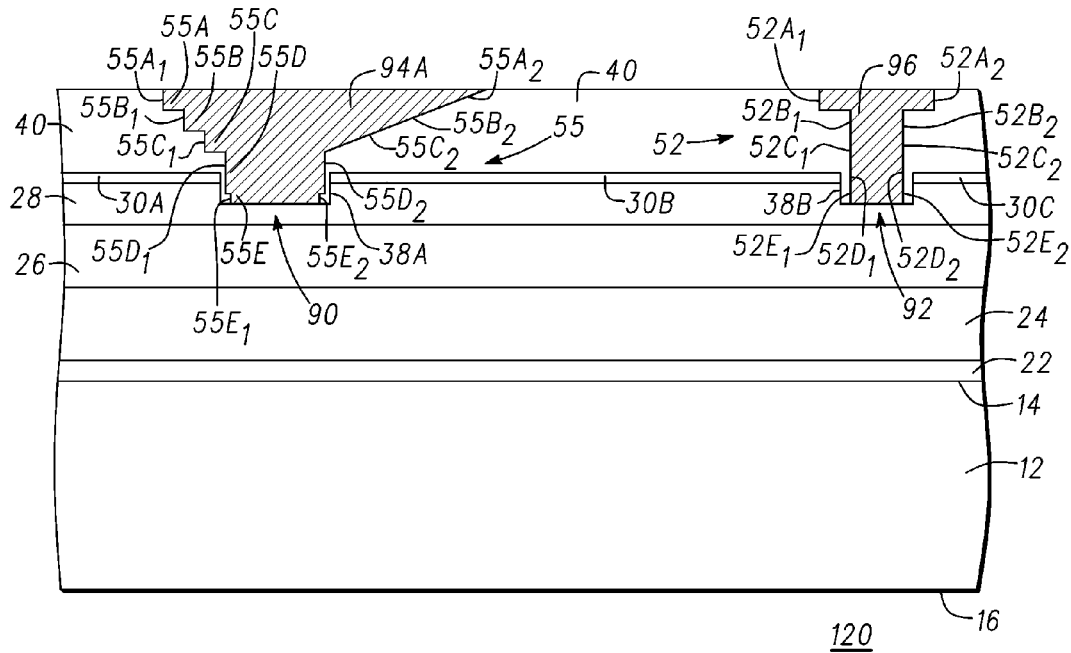
FIG. 13 is a cross-sectional view of the semiconductor component of FIG. 12 at a later stage of manufacture.

FIGS. 12 and 13 are cross-sectional views of a semiconductor component 120 during manufacture in accordance with another embodiment of the present invention. It should be noted that semiconductor component 120 is similar to semiconductor component 10 except that stepped contact 94 has been replaced by a stepped-sloped contact 94A, wherein the steps of stepped-sloped contact 94A that are on a side of stepped-sloped contact 94A facing T-shaped contact 96 are sloped or have a sloped configuration. FIG. 12 illustrates a stepped-sloped contact opening 55 formed in dielectric layer 40, comprising cavity portions 55A-55E. Cavity portion 55A has sidewalls $55A_1$ and $55A_2$, cavity portion 55B has sidewalls $55B_1$ and $55B_2$, cavity portion 55C has sidewalls $55C_1$ and $55C_2$, cavity portion 55D has sidewalls $55D_1$ and $55D_2$, and cavity portion 55E has sidewalls $55E_1$ and $55E_2$. Techniques for forming stepped-sloped contact opening 55 may be similar to those for forming stepped contact opening 50. Contact opening 55 is referred to as a stepped beveled contact opening or a stepped sloped contact opening because sidewalls $55A_1$-$55E_1$ form a stepped sidewall or are in a stepped configuration and sidewalls $55A_2$-$55E_2$ form a beveled sidewall or in a beveled configuration. The beveled configuration may be referred to as an angled configuration or a sloped configuration.

Referring now to FIG. 13, an electrically conductive material is formed in stepped-sloped contact opening 55 to form a stepped-sloped contact 94A and an electrically conductive material is formed in contact opening 52 to form a T-shaped contact 96. Techniques for forming the electrically conductive material of stepped-sloped contact 96A may be similar to those for forming single-sided stepped contact 94 or T-shaped contact 96. Because contact 94A is formed from a stepped-sloped opening, it may be referred to as a stepped-sloped contact and because contact 96 is formed from T-shaped contact opening 52, it may be referred to as a T-shaped contact.

Figure 14:
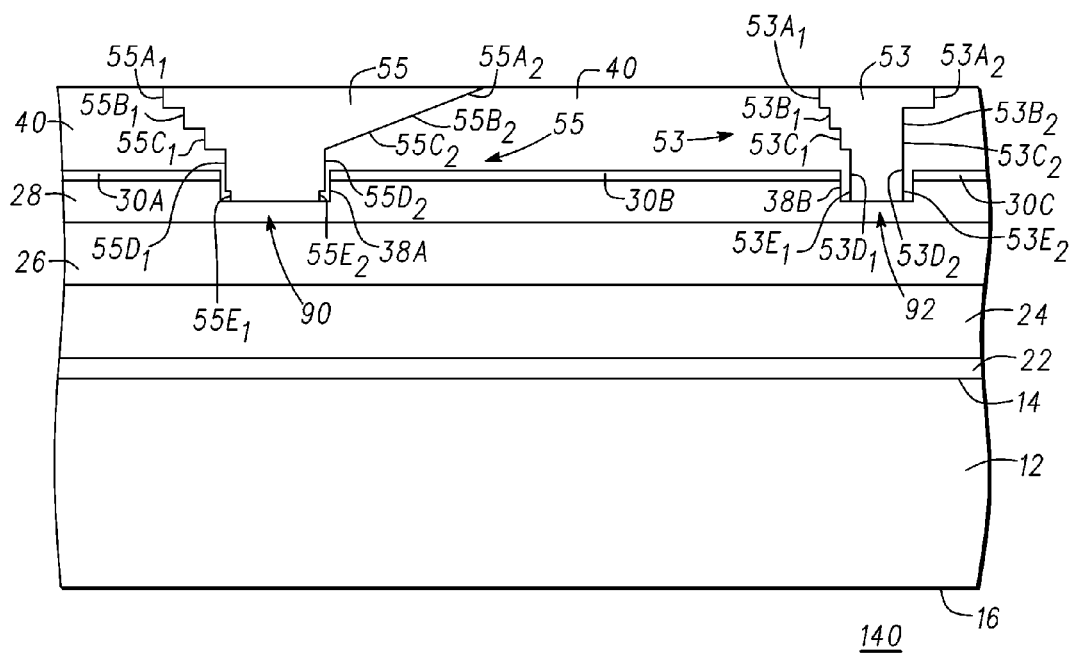
FIG. 14 is a cross-sectional view of a semiconductor component during manufacture in accordance with another embodiment of the present invention.
Figure 15:
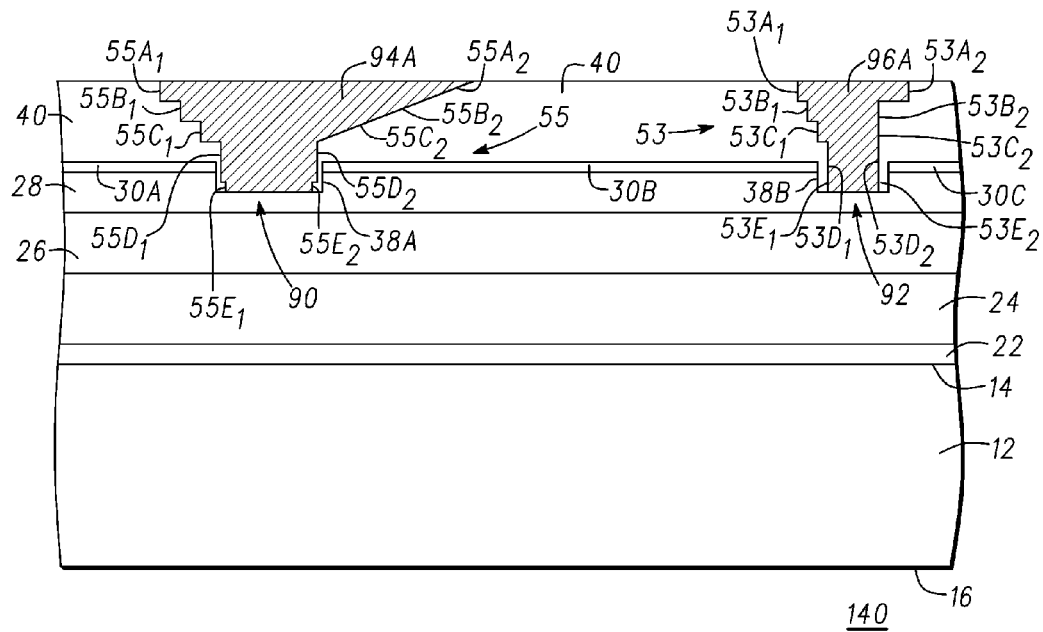
FIG. 15 is a cross-sectional view of the semiconductor component of FIG. 14 at a later stage of manufacture.

FIGS. 14 and 15 are cross-sectional views of a semiconductor component 140 during manufacture in accordance with another embodiment of the present invention. It should be noted that semiconductor component 140 is similar to semiconductor component 120 except that T-shaped contact 96 has been replaced by a stepped contact 96A. The sloped portion of stepped-sloped contact 94A is on a side of stepped-sloped contact 94A that faces the stepped portion of stepped contact 96A. FIG. 14 illustrates a stepped-sloped contact opening 55 formed in dielectric layer 40, comprising cavity portions 55A-55E and a stepped contact opening 53 comprising cavity portions 53A-53E. The formation of stepped-sloped contact opening 55 has been described with reference to FIGS. 12 and 13 and the formation of single-sided stepped contact opening 53 has been described with reference to FIGS. 10 and 11.

Referring now to FIG. 15, an electrically conductive material is formed in stepped-sloped contact opening 55 and in single-sided stepped contact opening 53 to form a stepped-sloped contact 94A and an electrically conductive material is formed in single-sided contact opening 53 to a single-sided stepped contact 96A.

Figure 16:
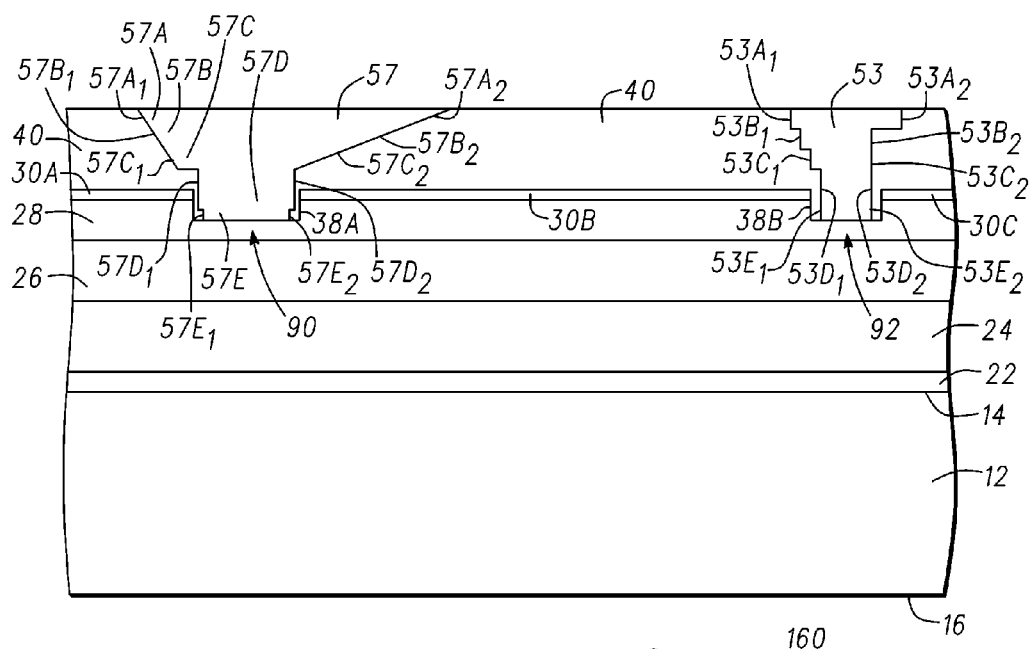
FIG. 16 is a cross-sectional view of a semiconductor component during manufacture in accordance with another embodiment of the present invention.
Figure 17:
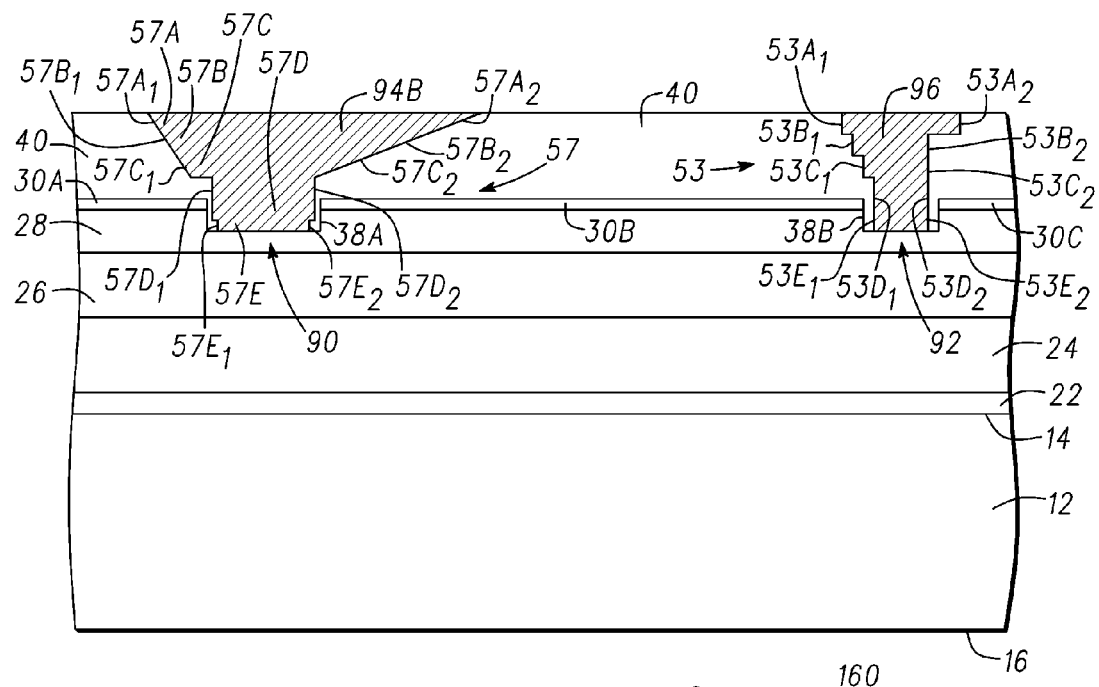
FIG. 17 is a cross-sectional view of the semiconductor component of FIG. 16 at a later stage of manufacture.

FIGS. 16 and 17 are cross-sectional views of a semiconductor component 160 during manufacture in accordance with another embodiment of the present invention. It should be noted that semiconductor component 160 is similar to semiconductor component 140 except that stepped-sloped contact 94A has been replaced by a double-sided beveled contact 94B. The stepped portion of stepped contact 96A contact is on a side that faces the sloped contact 94B. FIG. 16 illustrates a double-sided sloped contact opening 57 formed in dielectric layer 40, comprising cavity portions 57A-57E and a single-sided stepped contact opening 53 comprising cavity portions 53A-53E. Cavity portion 57A has sidewalls $57A_1$ and $57A_2$, cavity portion 57B has sidewalls $57B_1$ and $57B_2$, cavity portion 57C has sidewalls $57C_1$ and $57C_2$, cavity portion 57D has sidewalls $57D_1$ and $57D_2$, and cavity portion 57E has sidewalls $57E_1$ and $57E_2$. Single-sided stepped contact opening 53 has been described with reference to FIGS. 10 and 11. Double-sided sloped contact opening 57 may be referred to as a double-sided beveled contact opening or a double-sided angled contact opening or a double-sided slanted contact opening because sidewalls $57A_1$-$57C_1$ form a beveled or sloped sidewall and sidewalls $57A_2$-$57C_2$ form a beveled or sloped sidewall. In accordance with this embodiment, contact double-sided opening 57 may be referred to as being in a sloped configuration or an angled configuration, or a beveled configuration, or a slanged configuration.

Referring now to FIG. 17, an electrically conductive material is formed in double-sided sloped contact opening 57 and in single-sided stepped contact opening 53 to form a double-sided sloped contact 94B and an electrically conductive material is formed in single-sided stepped contact opening 53 to form a single-sided stepped contact 96.

Figure 18:
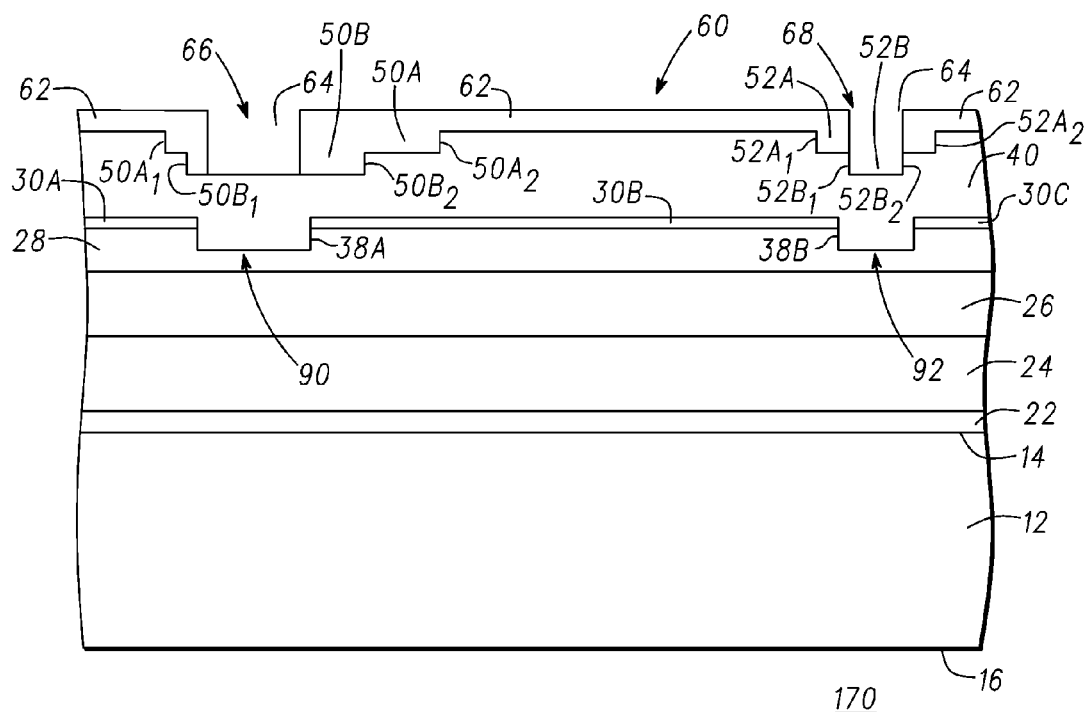
FIG. 18 is a cross-sectional view of a semiconductor component of FIG. 3 at a later stage of manufacture and in accordance with another embodiment of the present invention.

FIG. 18 is a cross-sectional view of a semiconductor component 170 in accordance with another embodiment of the present invention, wherein the description of FIG. 18 continues from the description of FIG. 3. It should be noted that reference character 10 in FIGS. 1-3 has been replaced by reference character 170 beginning with FIG. 18. The portions of dielectric layer 40 unprotected by masking elements 56 are removed using a wet etch that selectively etches the material of dielectric layer 40 to form cavity portions 50B and 52B, wherein cavity portion 50B has sidewalls $50B_1$ and $50B_2$ and cavity portion 52B has sidewalls $52B_1$ and $52B_2$. It should be noted that the width of cavity portion 52B is less than that of cavity portion 52A. By way of example, the wet etch is a timed etch and the etchant for the wet etch is a buffered oxide etchant when the material of dielectric layer 40 is oxide. Cavity portions 50A-Masking elements 56 are removed and a layer of photoresist is patterned over dielectric layer 40 to form a masking structure 60 having masking elements 62 and openings 64 that expose a portion 66 of dielectric layer 40 within cavity portions 50A and 50B and a portion 68 of dielectric layer 40 within cavity portions 52A and 52B.

Figure 19:
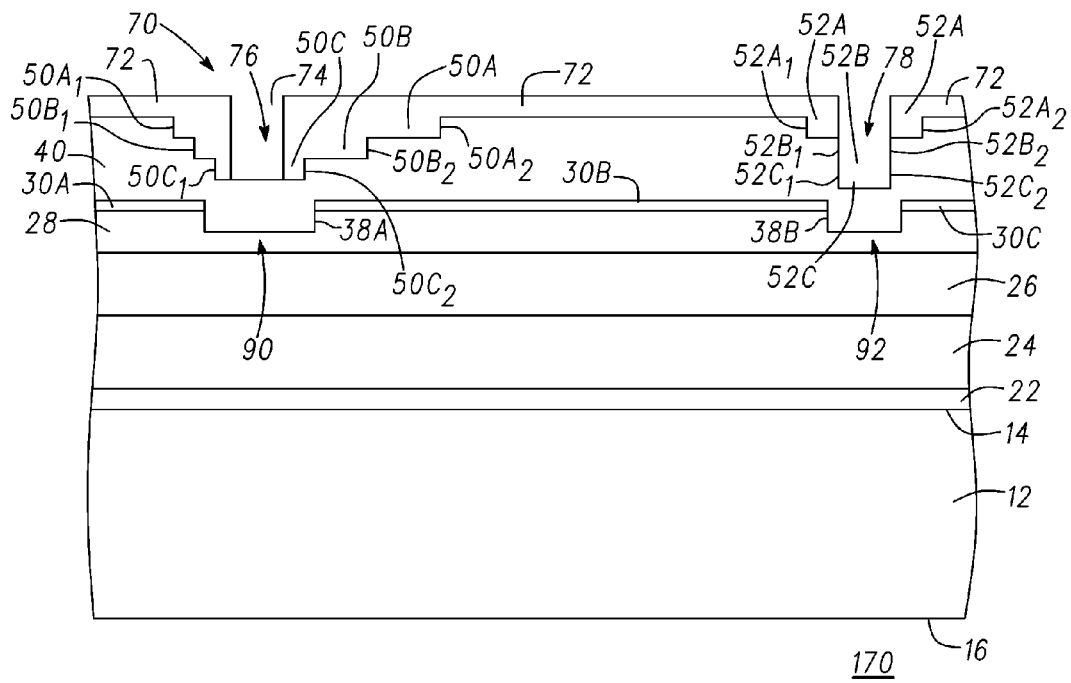
FIG. 19 is a cross-sectional view of the semiconductor component of FIG. 18 at a later stage of manufacture.

Referring now to FIG. 19, the portions of dielectric layer 40 unprotected by masking elements 62 are removed using a wet etch that selectively etches the material of dielectric layer 40 to form cavity portions 50C and 52C, where cavity portion 50C has sidewalls $50C_1$ and $50C_2$ and cavity portion 52C has sidewalls $52C_1$ and $52C_2$. By way of example, the wet etch is a timed etch and the etchant for the wet etch is a buffered oxide etchant when the material of dielectric layer 40 is oxide. Masking elements 62 are removed and a layer of photoresist is patterned over dielectric layer 40 to form a masking structure 70 having masking elements 72 and openings 74 that expose a portion 76 of dielectric layer 40 within cavity portions 50A, 50B, and 50C and a portion 78 of dielectric layer 40 within cavity portions 52A, 52B, and 52C.

Figure 20:
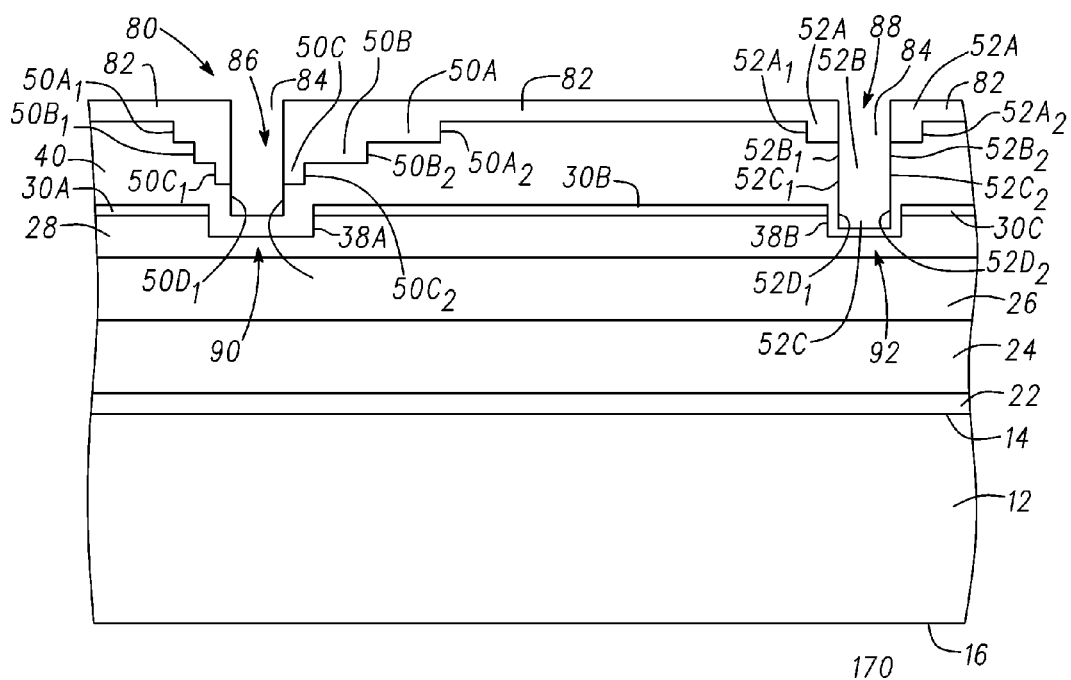
FIG. 20 is a cross-sectional view of the semiconductor component of FIG. 19 at a later stage of manufacture.

Referring now to FIG. 20, the portions of dielectric layer 40 unprotected by masking elements 72 are removed using a wet etch that selectively etches the material of dielectric layer 40 to form cavity portions 50D and 52D, wherein cavity portion 50D has sidewalls $50D_1$ and $50D_2$ and cavity portion 52D has sidewalls $52D_1$ and $52D_2$. By way of example, the wet etch is a timed etch and the etchant for the wet etch is a buffered oxide etchant when the material of dielectric layer 40 is oxide. Masking elements 72 are removed and a layer of photoresist is patterned over dielectric layer 40 to form a masking structure 80 having masking elements 82 and openings 84 that expose a portion 86 of dielectric layer 40 within cavity portions 50A, 50B, 50C, and 50D and a portion 88 of dielectric layer 40 within cavity portions 52A, 52B, 52C, and 52D.

Figure 21:
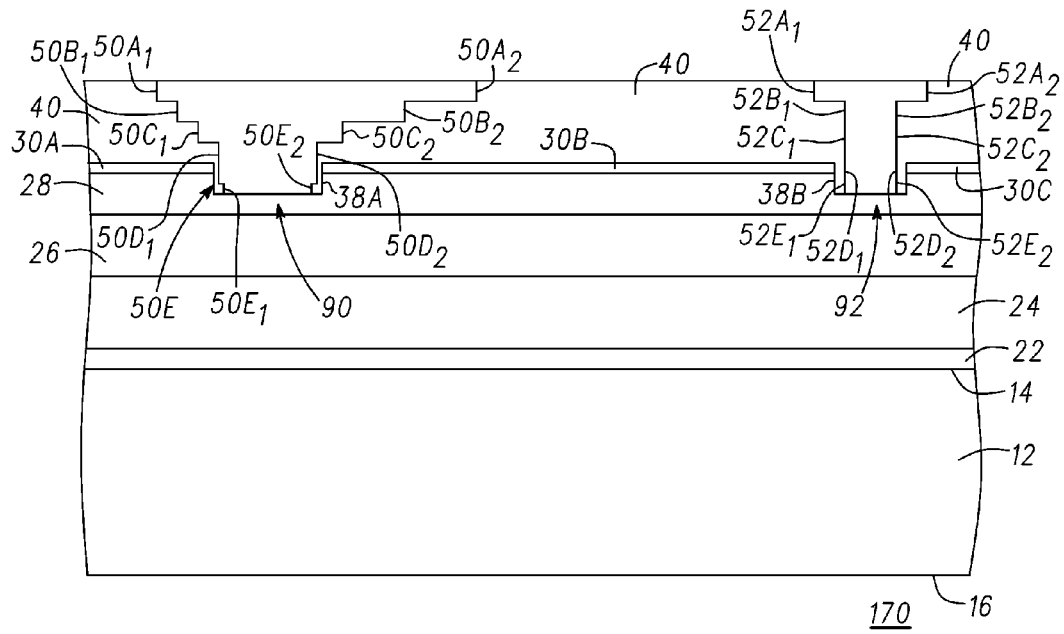
FIG. 21 is a cross-sectional view of the semiconductor component of FIG. 20 at a later stage of manufacture.

Referring now to FIG. 21, the portions of dielectric layer 40 unprotected by masking elements 82 are removed using a wet etch that selectively etches the material of dielectric layer 40 to form cavity portions 50E and 52E that expose portions 90 and 92, respectively, of strained layer 28. Cavity portion 50E has sidewalls $50E_1$ and $50E_2$, and cavity portion 52E has sidewalls $52E_1$ and $52E_2$. By way of example, the wet etch is a timed etch and the etchant for the wet etch is a buffered oxide etchant when the material of dielectric layer 40 is oxide. Masking elements 82 are removed. Cavity portions 50A-50E form a double-sided stepped cavity 50 or a double-sided stepped cavity structure 50 and cavity portions 52A-52E form a T-shaped cavity 52 or a T-shaped cavity structure. It should be noted that the formation of stepped cavity 50 and T-shaped cavity 52 have been described with reference to FIGS. 1-7. The reference characters for these cavities has been retained in FIGS. 18-21 because the structures differ regarding their centering or position formation relative to cavity 38B, i.e., cavity 52 of FIG. 21 is positioned such that edges $52E_1$ and $52E_2$ are spaced apart from the sidewalls of cavity 38B.

Figure 22:
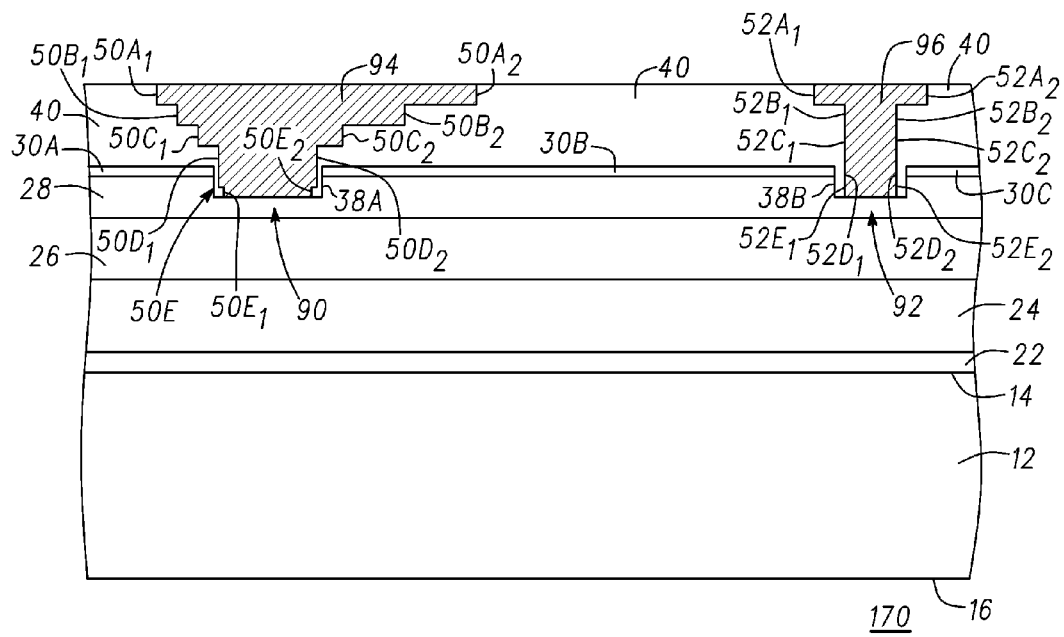
FIG. 22 is a cross-sectional view of the semiconductor component of FIG. 21 at a later stage of manufacture.

Referring now to FIG. 22, a contact 94 is formed from double-sided stepped cavity 50 and a contact 96 is formed from T-shaped cavity 52. Contacts 94 and 96 may be formed from metallization systems that include a refractory metal layer formed on dielectric layer 40 and on exposed portions 90 and 92 of strained layer 28, one or more barrier metal layers may be formed on the refractory metal layer, and a contact metal may be formed on the one or more barrier metal layers. Contact 94 formed in double-sided stepped cavity 50 is a step shaped contact and may be referred to as a field plate having a stepped configuration or a step-shaped configuration and contact 96 may be referred to as a T-shaped contact. In accordance with embodiments in which semiconductor component 170 is a diode, field plate 94 serves as a cathode of the diode and T-shaped contact 96 serves as an anode of the diode.

Figure 23:
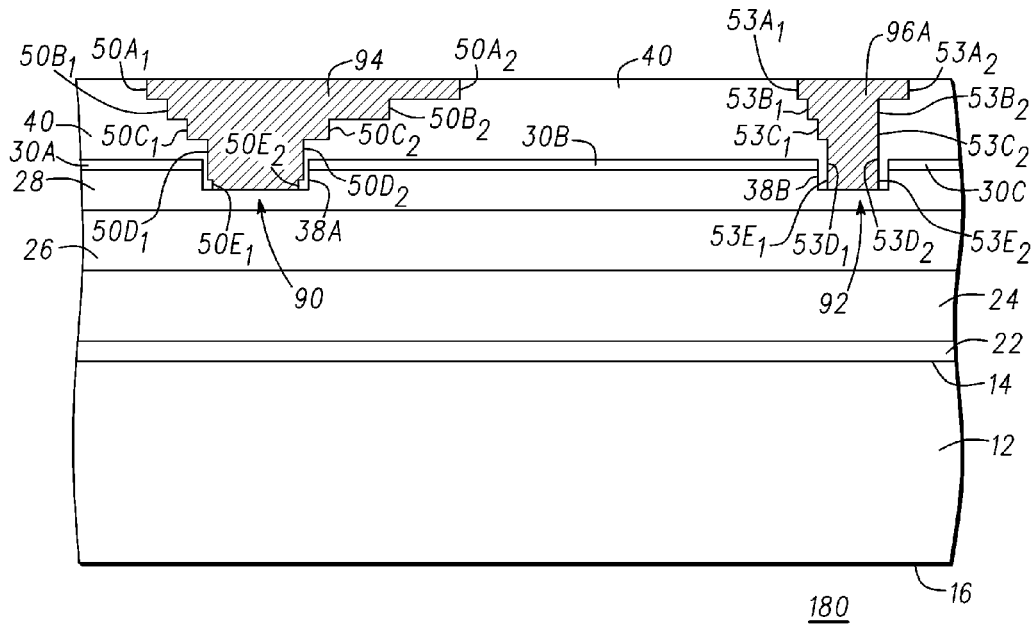
FIG. 23 is a cross-sectional view of a semiconductor component during manufacture in accordance with another embodiment of the present invention.

FIG. 23 is a cross-sectional view of a semiconductor component 180 during manufacture in accordance with another embodiment of the present invention. It should be noted that semiconductor component 180 is similar to semiconductor component 170 except that T-shaped contact 96 has been replaced by a single-sided stepped contact 96A, wherein the steps of single-sided contact 96A are on a side of stepped contact 96 that faces stepped contact 94. Thus a single-sided stepped contact opening 53 comprised of cavity portions 53A-53E is formed from dielectric layer 40. Techniques for forming single-sided stepped contact opening 53 may be similar to those for forming stepped contact opening 50. Likewise, techniques for forming single-sided stepped contact 96A may be similar to those for forming double-sided stepped contact 94 or T-shaped contact 96.

Figure 24:
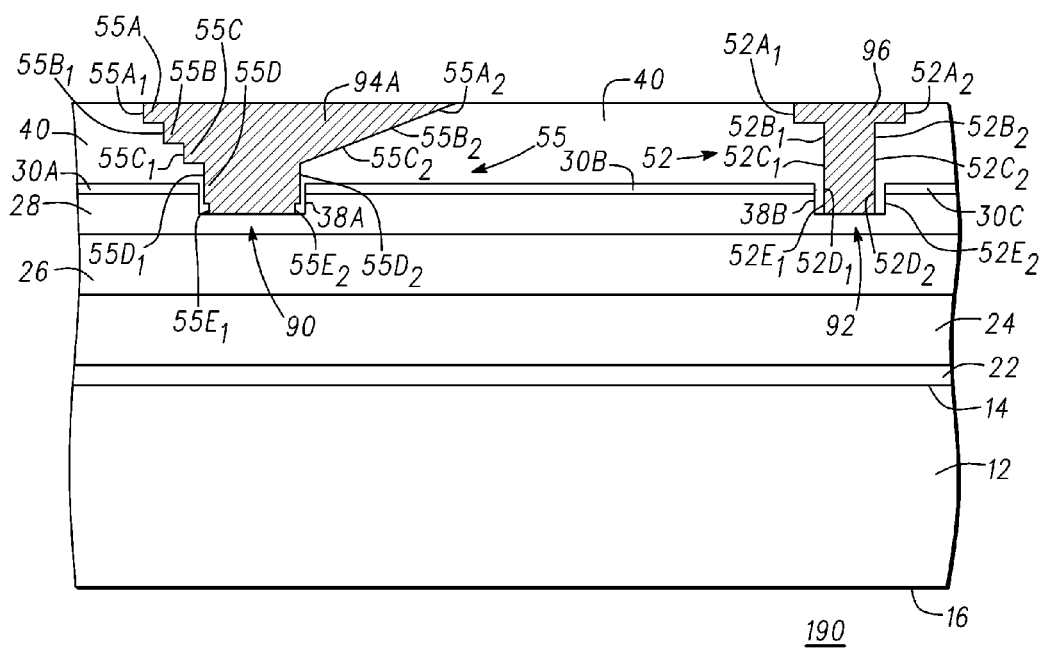
FIG. 24 is a cross-sectional view of a semiconductor component during manufacture in accordance with another embodiment of the present invention.

FIG. 24 is a cross-sectional view of a semiconductor component 190 during manufacture in accordance with another embodiment of the present invention. It should be noted that semiconductor component 190 is similar to semiconductor component 170 except that double-sided stepped contact 94 has been replaced by a stepped-sloped contact 94A, wherein the sidewall of single-sided stepped contact 94 that comprises steps is on a side of single-sided stepped contact 94 facing T-shaped contact 96 have been replaced with a sidewall having a sloped configuration. Thus a stepped-sloped contact opening 55 comprised of cavity portions 55A-55E is formed from dielectric layer 40. The sloped sidewall of the contact opening or cavity may be referred to as an angled sidewall, or a beveled sidewall or a slanted sidewall and opening 55 may be referred to as a stepped-sloped opening or stepped-sloped contact opening. Techniques for forming stepped-sloped contact opening 55 may be similar to those for forming double-sided stepped contact opening 50. Likewise, techniques for forming stepped-sloped contact 94A may be similar to those for forming double-sided stepped contact 94 or T-shaped contact 96.

Figure 25:
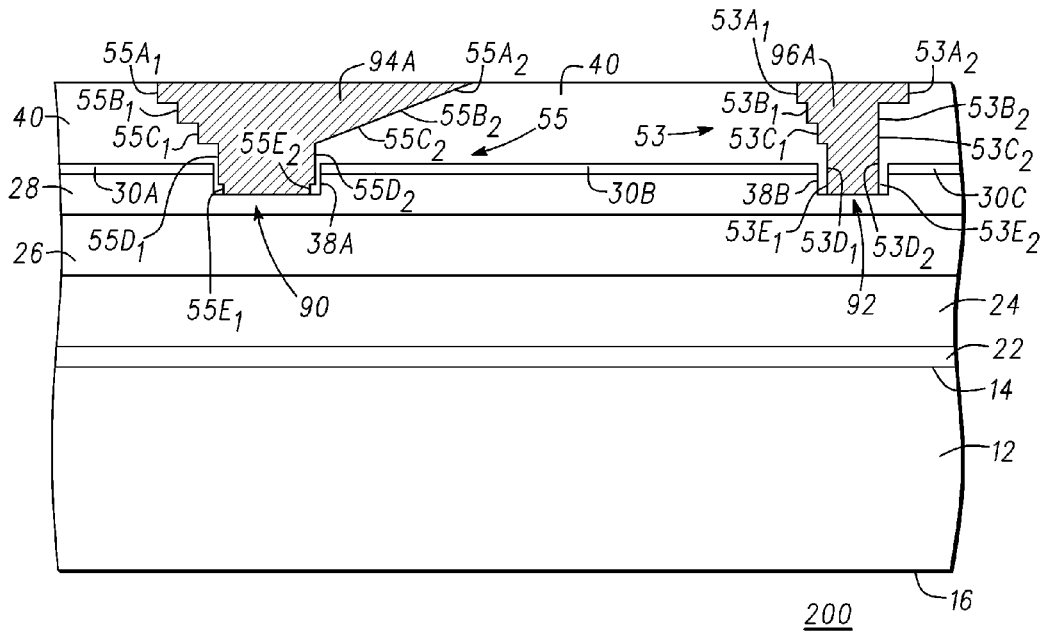
FIG. 25 is a cross-sectional view of a semiconductor component during manufacture in accordance with another embodiment of the present invention.

FIG. 25 is a cross-sectional view of a semiconductor component 200 during manufacture in accordance with another embodiment of the present invention. It should be noted that semiconductor component 200 is similar to semiconductor components 170 and 180 in that semiconductor component 200 includes stepped-sloped contact 94A and single-sided stepped contact 96A, wherein the sloped portion of stepped-sloped contact 94A is on the side of stepped-sloped contact 94A facing the single-sided stepped portion of contact 96A.

Figure 26:
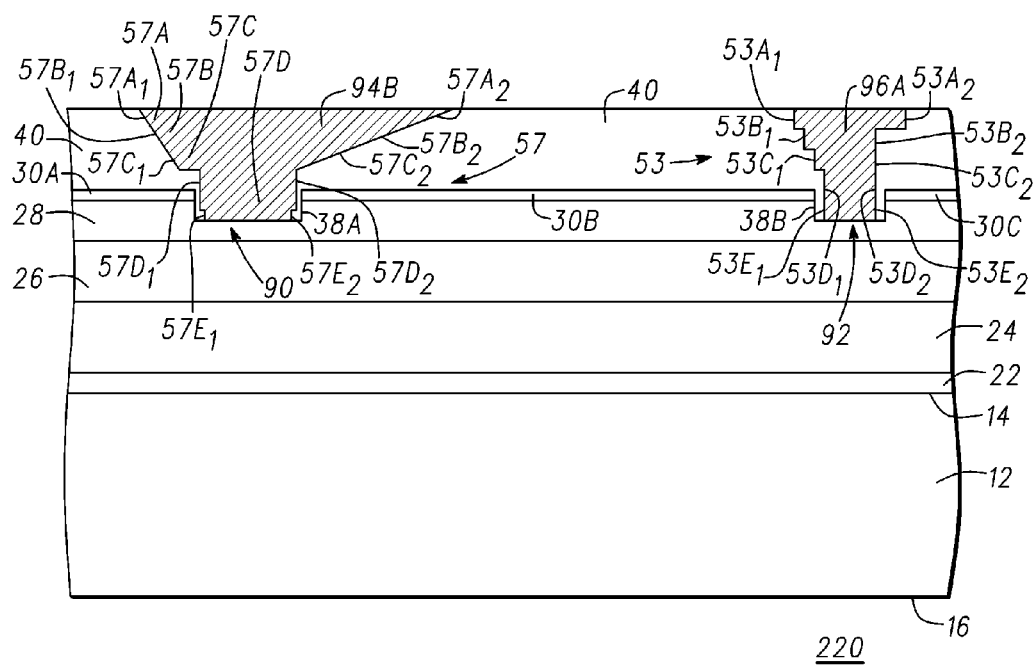
FIG. 26 is a cross-sectional view of a semiconductor component during manufacture in accordance with another embodiment of the present invention.

FIG. 26 is a cross-sectional view of a semiconductor component 220 during manufacture in accordance with an embodiment of the present invention. It should be noted that semiconductor component 220 is similar to semiconductor component 10 except that double-sided stepped contact 94 has been replaced by a double-sided sloped contact 94B. Thus a double-sided stepped contact opening 57 comprised of cavity portions 57A-57E is formed from dielectric layer 40. Techniques for forming double-sided stepped contact opening 57 may be similar to those for forming double-sided stepped contact opening 50. Likewise, techniques for forming double-sided sloped contact 94B may be similar to those for forming double-sided stepped contact 94 or T-shaped contact 96.

By now it should be appreciated that a semiconductor component having contacts with selectively shaped sidewalls and a method for manufacturing the semiconductor component have been provided. In accordance with various embodiments, the semiconductor component includes a contact that serves as field plate wherein the contact has sidewalls with different shapes. In one shape the sidewalls are stepped, in another shape the sidewalls are sloped, and in another shape one sidewall is stepped and the other sidewall is sloped. In addition the semiconductor includes a second contact that may be T-shaped, or has a sidewall that is stepped or a sidewall that is sloped. The field plate may serve as either an anode, a cathode, or both and anode and a cathode, wherein the field plates reduce electric fields at the contact edges and expand the depletion regions which increases the breakdown voltages. The field plates can be stepped, slanted, slope, and floated over the drift region between the anode and cathode. The number of steps, the ratios of the field plate lengths, slanting or sloping angles, and lengths can be optimized for dynamic Rdson and breakdown voltage. Field plates in accordance with embodiments of the present invention can be used with combinations of anode dielectric, recessed Schottky anode, and recessed cathode ohmic contacts. The field plates can be used with combination and stacks of different anode dielectric layers, passivation materials, and field dielectric materials such as nitrides and oxides (SiNx, AlNx, SiOx, SiONx, AlxOy) and high or low dielectric constant materials.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
providing a semiconductor material having a surface;
forming a passivation layer on the semiconductor material;
removing first and second portions of the passivation layer and portions of the semiconductor material exposed by removing the first and second portions of the passivation layer;
forming a layer of dielectric material on the passivation layer and the exposed portions of the semiconductor material;
forming first and second cavities in the layer of dielectric material, the first cavity exposing a first portion of the semiconductor material and having at least one sidewall configured as a portion of a field plate, the second cavity exposing a second portion of the semiconductor material; and
forming a first electrode in the first cavity and a second electrode in the second cavity.

2. The method of claim 1, wherein forming the first cavity comprises forming a first cavity portion having at least first and second sidewalls.

3. The method of claim 2, further including:
forming the first sidewall of the first cavity portion to have a first step having a first step distance; and
forming a second cavity portion having at least first and second sidewalls, the first sidewall of the second cavity portion having a second step that has a second step distance, the first step distance greater than the second step distance.

4. The method of claim 3, further including forming a third cavity portion having at least first and second sidewalls, the first sidewall of the third cavity portion having a third step that has a third step distance, the second step distance greater than the third step distance.

5. The method of claim 4, further including:
forming the second sidewall of the first cavity portion to have a fourth step having a fourth step distance;
forming the second sidewall of the second cavity portion to have a fifth step having a fifth step distance;

forming the second sidewall of the third cavity portion to have a sixth step having a sixth step distance; and wherein the fourth step distance, the fifth step distance, and the sixth step distance are the same distance and less than the first step distance.

6. The method of claim 4, further including forming the second cavity to have a T-shape.

7. The method of claim 1, further including forming the first cavity having a first portion with a first width and a second portion with a second width, the second width greater than the first width.

8. The method of claim 1, wherein providing the semiconductor material comprises:
providing a semiconductor substrate;
forming a nucleation layer on the semiconductor substrate;
forming a buffer region over the nucleation layer;
forming a channel layer over the buffer region; and
forming a strained layer over the channel layer.

9. The method of claim 8, wherein forming the buffer region includes forming one or more layers of a III-N material configured to be the buffer region.

10. A method for manufacturing a semiconductor component, comprising:
providing a semiconductor material, wherein the semiconductor material comprises a plurality of layers including a strained layer having a surface;
forming a first layer of dielectric material on the strained layer;
exposing first and second portions of the strained layer;
forming first and second cavities in the exposed portions of the first and second portions of the strained layer;
forming a second layer of dielectric material over the first layer of dielectric material and in the first and second cavities;
forming a first contact cavity in the second layer of dielectric material and a second contact cavity in the second layer of dielectric material, the first contact cavity exposing the first portion of the strained layer and the second contact cavity exposing the second portion; and
forming a first contact in the first contact cavity and a second contact in the second contact cavity, the first contact extending towards the second contact and serving as a field plate.

11. The method of claim 10, further including forming the first contact cavity having a plurality of asymmetric steps and forming the second contact cavity having a symmetric step.

12. The method of claim 11, wherein forming the first contact cavity having the plurality of asymmetric steps comprises:
forming a first portion of the first contact cavity having a first lateral dimension;
forming a second portion of the first contact cavity having a second lateral dimension, the second portion vertically adjacent the first portion and the first lateral dimension greater than the second lateral dimension; and
forming a third portion of the first contact cavity having a third lateral dimension, the third portion vertically adjacent the second portion and the second lateral dimension greater than the third lateral dimension.

13. The method of claim 12, further including forming the first contact cavity having a plurality of asymmetric steps and forming the second contact cavity having a T-shape.

14. The method of claim 10, further including forming the first contact cavity having first and second opposing sidewalls, the first opposing sidewall having a sloped shape.

15. The method of claim 14, wherein forming the first contact cavity further includes forming the second opposing sidewall having a sloped shape.

16. The method of claim 14, wherein forming the first contact cavity further includes forming the second opposing sidewall having a stepped shape.

17. The method of claim 16, further including forming the second contact cavity having a sidewall with a stepped shape, wherein the sidewall with the stepped shape faces the first contact cavity.

18. The method of claim 16, further including forming the second cavity having a T-shape sidewall that faces the second opposing sidewall of the first contact cavity.

* * * * *